(12) United States Patent
Freeman et al.

(10) Patent No.: US 7,166,169 B2
(45) Date of Patent: Jan. 23, 2007

(54) VAPORIZATION SOURCE WITH BAFFLE

(75) Inventors: Dennis R. Freeman, Spencerport, NY (US); Neil P. Redden, Sodus Point, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 11/032,899

(22) Filed: Jan. 11, 2005

(65) Prior Publication Data

US 2006/0150915 A1    Jul. 13, 2006

(51) Int. Cl.
*C23C 14/24* (2006.01)

(52) U.S. Cl. ................................. 118/726; 392/389

(58) Field of Classification Search ............. 118/726; 392/389
See application file for complete search history.

(56) References Cited

U.S. PATENT DOCUMENTS

| | | | | |
|---|---|---|---|---|
| 2,440,135 | A * | 4/1948 | Alexander | 427/248.1 |
| 2,447,789 | A | 8/1948 | Barr | |
| 4,551,303 | A * | 11/1985 | Moriguchi et al. | 420/590 |
| 4,769,292 | A | 9/1988 | Tang et al. | |
| 4,885,211 | A | 12/1989 | Tang et al. | |
| 5,182,567 | A * | 1/1993 | Wilder | 392/389 |
| 5,216,742 | A * | 6/1993 | Krug et al. | 118/726 |
| 6,202,591 | B1 * | 3/2001 | Witzman et al. | 118/726 |
| 6,237,529 | B1 * | 5/2001 | Spahn | 118/726 |
| 6,717,358 | B1 | 4/2004 | Liao et al. | |
| 6,995,509 | B2 | 2/2006 | Yamazaki et al. | |
| 2003/0015140 | A1 * | 1/2003 | Van Slyke et al. | 118/723 VE |
| 2003/0099860 | A1 | 5/2003 | Lin et al. | |
| 2003/0168013 | A1 * | 9/2003 | Freeman et al. | 118/726 |
| 2004/0042770 | A1 * | 3/2004 | Choe et al. | 392/389 |
| 2005/0051097 | A1 * | 3/2005 | Koninckx et al. | 118/726 |

FOREIGN PATENT DOCUMENTS

| | | |
|---|---|---|
| EP | 0 982 411 A2 | 3/2000 |
| EP | 1 316 625 | 6/2003 |
| JP | 59-043876 | 3/1984 |
| JP | 05-139882 * | 6/1993 |
| WO | 03/062486 A1 | 7/2003 |
| WO | 03/079420 A1 | 9/2003 |
| WO | WO 2004/060026 | 7/2004 |
| WO | WO 2005/098079 | 10/2005 |
| WO | WO 2005/115059 | 12/2005 |

OTHER PUBLICATIONS

V. Bulovic et al., "Tuning the color emission of thin film molecular organic light emitting devices by the solid state solvation effect", Chemical Physics Letters, vol. 308, Jul. 23, 1999, pp. 317-322, XP002370304.

* cited by examiner

*Primary Examiner*—Richard Bueker
(74) *Attorney, Agent, or Firm*—Raymond L. Owens

(57) ABSTRACT

A vapor deposition source for depositing organic material includes a boat having a cavity for holding organic material and an aperture plate, having a plurality of spaced apertures, for enclosing the boat. The vapor deposition source also includes a heating element provided in the cavity between the aperture plate and the organic material, and a baffle member in contact with the heating element and having at least three surfaces which absorb energy from the heating element, the first surface redirecting energy to the aperture plate and the second and third surfaces redirecting energy to the boat walls and the organic material.

5 Claims, 2 Drawing Sheets

VAPORIZATION SOURCE WITH BAFFLE

CROSS REFERENCE TO RELATED APPLICATIONS

Reference is made to commonly assigned U.S. patent application Ser. No. 10/971,698 filed Oct. 25, 2004, by Dennis R. Freeman, et al., entitled "Elongated Thermal Physical Vapor Deposition Source With Plural Apertures" (a continuation-in-part of U.S. patent application Ser. No. 10/093,739 filed Mar. 8, 2002, now abandoned); commonly assigned U.S. patent application Ser. No. 10/352,558 filed Jan. 28, 2003, by Jeremy M. Grace, et al., entitled "Method of Designing a Thermal Physical Vapor Deposition System"; and commonly assigned U.S. patent application Ser. No. 11/032,982 filed concurrently herewith, by Dennis R. Freeman, et al., entitled "Customized One Time Vapor Deposition Source", the disclosures of which are herein incorporated by reference.

FIELD OF THE INVENTION

The present invention relates to the field of physical vapor deposition where a source material is heated to a temperature so as to cause vaporization and produce a vapor plume to form a thin film on a surface of a substrate.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide angle viewing and capability for full color flat emission displays. Tang, et al. described this multilayer OLED device in their U.S. Pat. Nos. 4,769,292 and 4,885,211.

Physical vapor deposition in a vacuum environment is the principal way of depositing thin organic material films as used in small molecule OLED devices. Such methods are well known, for example in Barr U.S. Pat. No. 2,447,789 and Tanabe, et al. EP 0 982 411 A2. Linear deposition sources of the prior art typically are capable of achieving thickness uniformity specifications of ±10% and have more recently achieved ±4%. This has been adequate for early OLED devices but is not adequate for OLED devices that rely on the organic layer stack thickness to act as a resonance cavity and thereby increase the intensity of the emitted light. For these devices to be effective, it is necessary to control the cavity thickness to within ±1 to 2%.

To achieve these thickness uniformity objectives, it is necessary to control the uniformity of the vapor flow through the source exit aperture or apertures and to additionally tailor the flow in a manner that compensates for losses at the edges of the substrate. The observed film thickness from a source with uniform vapor flow along its length depositing a film on a equal size substrate shows a fairly uniform central region that is bordered by end regions where the film thickness declines at an increasing rate toward the edge of the substrate.

Increasing the distance from the source to the substrate, known as the throw distance, and increasing the length of the source relative to the width of the substrate has the effect of increasing the thickness uniformity over the substrate. The prior art has achieved increased thickness uniformity by increasing the throw distance and using sources that can be as much as twice as wide as the substrate. For example, WO 03/062486 A1 discusses the need to increase throw distance as the substrate size increases. This strategy requires large deposition chambers, results in very low deposition rates on the substrate and wastes the vast majority of sublimated organic material.

To reduce the disparity between the length of the source and the width of the substrate, dog-bone shaped slit apertures and the use of discrete apertures whose size or packing density increases toward the ends of the source have been described by Lee, et al. in WO 03/079420 A1 to deliver higher vapor flow at the ends of the substrate and thereby compensate for the usual thickness decline. This practice improves the thickness uniformity.

For linear sources operated at short throw distances, there is less thickness variation of the deposited film between the ends of the substrate and the center, but local variations in vapor plume density become apparent in the deposited film. This is especially true in sources where the exit aperture is composed of multiple discrete orifices. There is thus a continuing need to improve the vapor plume uniformity in multi-orifice vaporization devices.

SUMMARY OF THE INVENTION

It is therefore an object of the present invention to achieve increased thickness uniformity in depositing vaporized organic material while reducing the amount of organic material lost through waste.

This object is achieved by a vapor deposition source for depositing organic material comprising:
 a) a boat having a cavity for holding organic material;
 b) an aperture plate, having a plurality of spaced apertures, for enclosing the boat;
 c) a heating element provided in the cavity between the aperture plate and the organic material; and
 d) a baffle member in contact with the heating element and having at least three surfaces which absorb energy from the heating element, the first surface redirecting energy to the aperture plate and the second and third surfaces redirecting energy to the boat walls and the organic material.

ADVANTAGES

It is an advantage of the present invention that it increases the uniformity of vaporized organic material released by the source. It is a further advantage that only a portion of organic material is exposed to vaporization temperatures at a given time, thereby reducing material degradation. It is a further advantage that the charge of organic material is more evenly vaporized. It is a further advantage that condensation of organic vapors on the side walls of the apparatus is greatly reduced. It is a further advantage of this invention that a series of apertures can be used for release of the organic material vapors without the necessity of heating the apertures directly, thus simplifying construction and permitting more materials and more sealing methods to be used in construction of the device. It is a further advantage of this invention that it can be used for a single use vaporization source.

DETAILED DESCRIPTION OF THE INVENTION

Figure 1:
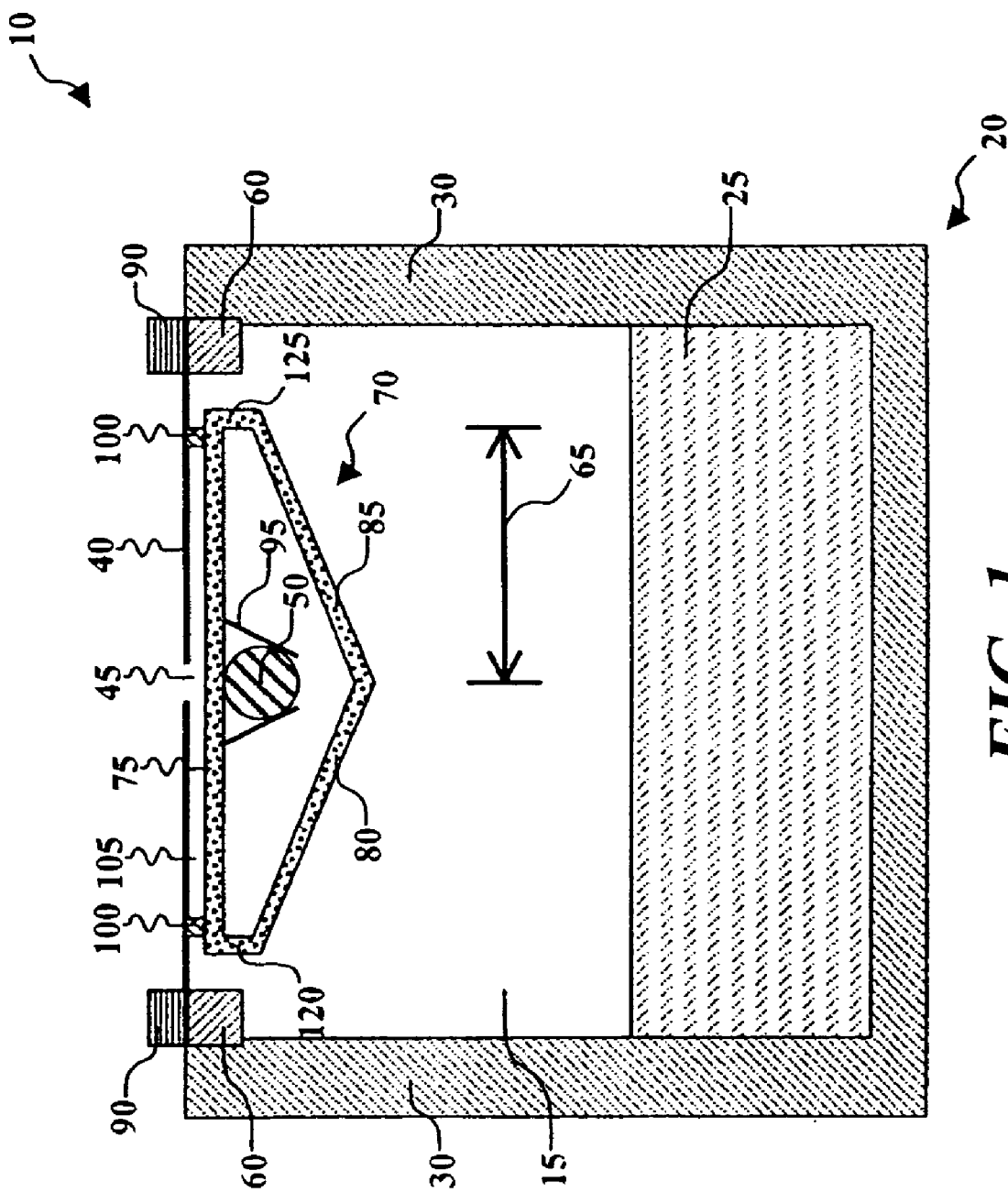
FIG. 1 shows a cross sectional view of a low cost vapor deposition source for depositing organic materials in accordance with this invention.

Turning now to FIG. 1, there is shown a cross sectional view of a vapor deposition source for depositing organic material in accordance with this invention. Vapor deposition source 10 includes a boat 20, which is so constructed with a cavity 15 for holding a charge of organic material 25 and can be sealed as will be seen. Organic material 25 provided in cavity 15 is commonly material that is solid at room temperature and will be further detailed below. A top portion 60 can be attached to boat 20 by various ways, or can be an integral part of boat 20, e.g., by being cast or molded as a single structure.

Vapor deposition source 10 includes an aperture plate 40 that has a plurality of spaced apertures 45. Aperture plate 40 is designed to emulate boat 20 so as to make a leak free seal. Various ways of making airtight seals can be used. For example, clamping means 90 can hold aperture plate 40 in place via the use of bolts to top portion 60. A gasket, for example made out of graphite foil, can be provided between aperture plate 40 and top portion 60, or between aperture plate 40 and clamping means 90, or both. Other sealing means are also possible. For example, aperture plate 40 can be attached to and sealed with top portion 60 by such ways as swaging, crimping, screwing with a flange and gasket, or welding to form a leak free seal.

Both boat 20 and aperture plate 40 can be constructed from a variety of materials. For structural stability and the ability to withstand the high temperatures necessary to vaporize organic material 25, metals such as stainless steel, molybdenum, titanium, gold, platinum, and tantalum are particularly useful.

Vapor deposition source 10 further includes a heating element 50, which is provided in cavity 15 between aperture plate 40 and organic material 25. Heating element 50 traverses the length of vapor deposition source 10. It can be a solid piece of resistive metal through which current is passed and can be connected to a power supply (not shown) at each exposed end. Alternatively, heating element 50 can be a cartridge heater where insulated resistive wiring is encased in a tube and wire leads (not shown) are connected to a power supply.

Baffle member 70 traverses the length of vapor deposition source 10 and is provided in a predetermined spaced relationship to aperture plate 40 and spaced from boat 20. Baffle member 70 is in contact with and encloses heating element 50. Heating element 50 is supported at the ends of boat 20, as will be seen, and can support baffle member 70. Baffle member 70 can optionally include guides 95 at intervals along its length so as to better position the baffle member within the vapor deposition source. Baffle member 70 can comprise metals such as stainless steel, molybdenum, titanium, gold, platinum, and tantalum. Also useful are exterior surface coatings and treatments that increase the infrared emissivity of baffle member 70. Coatings include e.g. a carbon-black layer, while surface treatments include a matte surface. Such coatings and treatments are well-known to those skilled in the art.

The periphery of baffle member 70 is triangular or substantially triangular, that is, it defines at least three surfaces, e.g. first surface 75, second surface 80, and third surface 85, that surround heating element 50 so as to absorb infrared energy from the heating element and redirect that energy.

Baffle member 70 can also include additional surfaces, e.g. surfaces 120 and 125, if required by the geometry of the device or for simplifying the construction of baffle member 70. Such additional surfaces are not required for this invention and the actual configuration of baffle member 70 will be determined in part by the geometry of boat 20. First surface 75 of baffle member 70 is in contact with heating element 50 and is disposed in parallel relation to aperture plate 40 in a predetermined spaced relationship, thus forming vapor path 105 between baffle member 70 and aperture plate 40. To reduce variations in the conductance of the organic vapor in vapor deposition source 10 to achieve uniformity of vapor emission, the ratio of the length of vapor path 105, represented by distance 65, to the width of the vapor path is selected to be at least 10:1 so as to reduce variations in pressure in vapor deposition source 10. However, those skilled in the art will realize that a number of factors determine the conductance of organic vapor within boat 20 and through vapor path 105 and aperture 45. The conductance ratio can be determined as described in commonly assigned U.S. patent application Ser. No. 10/352,558 filed Jan. 28, 2003, by Jeremy M. Grace, et al., entitled "Method of Designing a Thermal Physical Vapor Deposition System", the disclosure of which is herein incorporated by reference, to adjust size of boat 20 and apertures 45, and the size and position of baffle member 70, to produce the desired vapor uniformity and emission rate. Baffle member 70 can include stand-offs 100 in predetermined locations, e.g. near the corners of baffle member 70, to help maintain the position of the baffle member and the predetermined spaced relationship with aperture plate 40. Second and third portions of baffle member 70 define an additional two surfaces, that is second surface 80 and third surface 85, respectively, that are spaced from heating element 50.

Baffle member 70 and its surfaces are disposed to absorb infrared energy from heating element 50 and constructed to redirect such infrared energy. First surface 75 will redirect the infrared energy to aperture plate 40 and thus prevent condensation of organic material and plugging of apertures 45. Second and third surfaces 80 and 85, respectively, are arranged to redirect infrared energy to opposing sides of organic material 25, thus providing more even distribution of the energy and preventing preferential vaporization of organic material 25 in the center, and to boat walls 30, thus preventing condensation of vaporized organic material on the walls.

Any organic material 25 capable of vapor deposition can be used in this invention. Organic materials useful for making OLED devices are particularly envisioned (see below).

Organic material 25 is provided into boat 20 in the appropriate amount. The organic material can be a single type of material or a mixture of multiple materials. If a mixture, it is advantageous if they both have similar vapor pressure properties. The organic material can be provided as a powder, as granules, tablets, or other convenient form. If provided as a powder or as granules, the organic material can be compacted (e.g., with heat and pressure) in the boat in order to form a large solid mass. When its physical properties permit, the organic material can be melted and provided into the boat as a liquid and then permitted to resolidify. Alternatively, when its physical properties permit, the organic material can be dissolved in a low boiling solvent and provided into the boat as a liquid solution, and then permitted to recrystallize upon evaporation of the solvent. The tablets, compacted materials, resolidified and recrystallized materials can be advantaged relative to powders and granules because they have a higher density. This can increase the length of uninterrupted use of vapor deposition source 10. When the organic material is formed in one or a few large-sized pieces, they can be held in place by tabs, pins, or other mechanisms. Powders, on the other hand, can shift with movement. The powder may need to be moved back into the bottom of the boat by some tipping and gentle shaking. Although this should not be problematic, having organic material that stays in place is advantaged.

After vapor deposition source 10 has been assembled, it should be sealed in an inert atmosphere, preferably with a desiccant or getter, if use is not immediate. Tape or some other removable material should be placed over the aperture holes to maintain the internal inert atmosphere (e.g., Ar or nitrogen) of the vapor deposition source 10. The tape can optionally contain a desiccant or a getter.

A general structure for an OLED device can include, in sequence, anode/hole-injecting layer/hole-transporting layer/light-emitting layer/electron-transporting layer/cathode. The organic materials suitable for this invention are typically the ones between the anode and cathode. A non-limiting set of example materials that can be used to fabricate various layers of an OLED device include the following.

Hole-Injecting Layer (HIL)

It is often useful to provide a hole-injecting layer between the anode and hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432 and some aromatic amines, for example, m-MTDATA (4,4',4"-tris[(3-methylphenyl)phenylamino]triphenylamine.

Hole-Transporting Layer (HTL)

The hole-transporting layer contains at least one hole-transporting compound such as an aromatic tertiary amine, where the latter is understood to be a compound including at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. U.S. Pat. No. 3,180,730. Other suitable triarylamines substituted with one or more vinyl radicals and/or comprising at least one active hydrogen containing group are disclosed by Brantley, et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1":4",1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl 2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Some hole-injecting materials described in EP 0 891 121 A1 and EP 1 029 909 A1, can also make useful hole-transporting materials.

Light-Emitting Layer (LEL)

As more fully described in U.S. Pat. Nos. 4,769,292 and 5,935,721, each of the light-emitting layers (LEL) of the organic EL element include a luminescent fluorescent or phosphorescent material where electroluminescence is produced as a result of electron-hole pair recombination in this region. The light-emitting layer can be comprised of a single material, but more commonly contains a host material doped with a guest emitting material or materials where light emission comes primarily from the emitting materials and can be of any color. This guest emitting material is often referred to as a light-emitting dopant. The host materials in the light-emitting layer can be an electron-transporting material, as defined below, a hole-transporting material, as defined above, or another material or combination of materials that support hole-electron recombination. The emitting material is typically chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)];
CO-2: Magnesium bisoxine [alias, bis(8-quinolinolato) magnesium(II)];
CO-3: Bis[benzo{f}-8-quinolinolato]zinc(II);
CO-4: Bis(2-methyl-8-quinolinolato)aluminum(III)-μ-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato)aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Another class of useful host materials includes derivatives of anthracene, such as those described in U.S. Pat. Nos. 5,935,721, 5,972,247, 6,465,115, 6,534,199, 6,713,192, U.S. Patent Application Publications 2002/0048687, 2003/0072966, and WO 2004/018587. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2, 2', 2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyryilium compounds, fluorene derivatives, periflanthene derivatives, indenoperylene derivatives, bis(azinyl)amine boron compounds, bis(azinyl)methane boron compounds, derivatives of distyrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Examples of useful phosphorescent materials that can be used in light-emitting layers of this invention include, but are not limited to, those described in WO 00/57676, WO 00/70655, WO 01/41512 A1, WO 02/15645 A1, WO 01/93642 A1, WO 01/39234 A2, WO 02/071813 A1, WO 02/074015 A2, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, U.S. Pat. Nos. 6,458,475, 6,573,651, 6,451,455, 6,413,656, 6,515,298, 6,451,415, 6,097,147, EP 1 239 526 A2, EP 1 238 981 A2, EP 1 244 155 A2, JP 2003/073387A, JP 2003/073388A, JP 2003/059667A, and JP 2003/073665A.

Electron-Transporting Layer (ETL)

Preferred thin film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Figure 2:
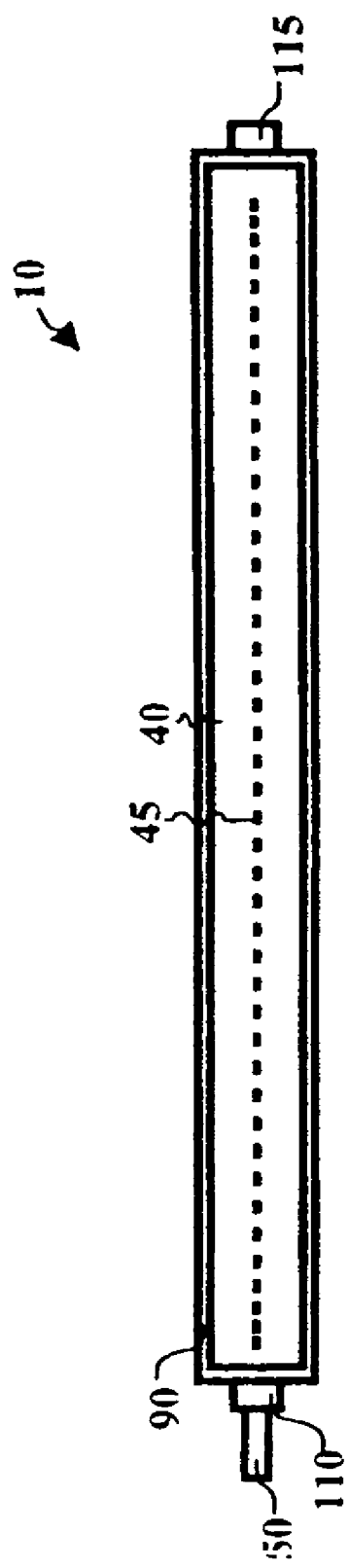
FIG. 2 shows a top view of the above vapor deposition source.

Turning now to FIG. 2, there is shown a top view of the above vapor deposition source 10. Open-ended collar 110 and closed-ended collar 115 serve to support heating element 50, and therefore also support baffle member 70 as described above. Collars 110 and 115 can be made of an electrically insulating material. If heating element 50 is a solid piece of resistive metal, then collars 110 and 115 should be electrically insulating. Preferably, the collars also produce an effective seal between heating element 50 and boat 20 so that vapor does not escape by this path. Aperture plate 40 has a series of apertures 45 along its length for release of organic material vapors from vapor deposition source 10. Apertures 45 can be of a uniform size and spacing in the center of the aperture distribution. However, to maintain uniform coating over the entire length of aperture plate 40, it is necessary to adjust the size or spacing, or both, of the apertures at the ends, as described in commonly assigned U.S. patent application Ser. No. 10/971,698 filed Oct. 25, 2004, by Dennis R. Freeman, et al., entitled "Elongated Thermal Physical Vapor Deposition Source With Plural Apertures" (a continuation-in-part of U.S. patent application Ser. No. 10/093,739 filed Mar. 8, 2002, now abandoned), the disclosure of which is herein incorporated by reference The invention has been described in detail with particular reference to certain preferred embodiments thereof, but it will be understood that variations and modifications can be effected within the spirit and scope of the invention.

PARTS LIST 10 vapor deposition source
15 cavity
20 boat
25 organic material
30 boat wall
40 aperture plate
45 aperture
50 heating element
60 top portion
65 distance
70 baffle member
75 first surface
80 second surface
85 third surface
90 clamping means
95 guide
100 stand-off
105 vapor path
110 open-ended collar
115 closed-ended collar
120 surface
125 surface

The invention claimed is:

1. A vapor deposition source-for depositing organic material comprising:
   a) a boat having a cavity for holding organic material;
   b) an aperture plate, having a plurality of spaced apertures, for enclosing the boat;
   c) a heating element provided in the cavity between the aperture plate and the organic material; and
   d) a baffle member without openings in contact with the heating element and having at least three surfaces which absorb energy from the heating element, the first surface redirecting energy to the aperture plate and the second and third surfaces redirecting energy to the boat walls and the organic material, wherein the periphery of the baffle member is triangular.

2. The source of claim 1, wherein the boat and the aperture plate are constructed from stainless steel.

3. The source of claim 1, wherein the baffle member and the aperture plate form a vapor path and wherein the ratio of the length of the vapor path to the width is at least 10:1.

4. A vapor deposition source for depositing organic material comprising:
   a) a boat having a cavity for holding organic material;
   b) an aperture plate, having a plurality of spaced apertures, for enclosing the boat;
   c) a heating element provided in the cavity between the aperture plate and the organic material; and
   d) a baffle member without openings spaced from the boat and the aperture plate and disposed in relation to the heating element to absorb infrared energy from the heating element, and constructed to redirect infrared energy to the apertures in the aperture plate and to the organic material in the boat and the boat walls, the baffle member being provided in a predetermined spaced relationship to the aperture plate to thereby reduce variations in the conductance of the organic vapor from the source to reduce variations in pressure in the vapor deposition source, wherein the periphery of the baffle member is triangular.

5. The source of claim 4, wherein the boat and the aperture plate are constructed from stainless steel.

* * * * *